(12) United States Patent
Morrow et al.

(10) Patent No.: US 7,836,302 B2
(45) Date of Patent: Nov. 16, 2010

(54) DEVICE VERIFICATION SYSTEM AND METHOD

(75) Inventors: James W. Morrow, Sparks, NV (US); Lawrence McAllister, Las Vegas, NV (US); Robert Dubner, Westwood, NJ (US); David Carman, Glenwood, MD (US)

(73) Assignee: Bally Gaming, Inc., Las Vegas, NV (US)

( * ) Notice: Subject to any disclaimer, the term of this patent is extended or adjusted under 35 U.S.C. 154(b) by 978 days.

(21) Appl. No.: 11/464,594

(22) Filed: Aug. 15, 2006

(65) Prior Publication Data

US 2006/0288200 A1 Dec. 21, 2006

Related U.S. Application Data

(62) Division of application No. 10/243,912, filed on Sep. 13, 2002, now abandoned.

(51) Int. Cl.
*G06F 21/00* (2006.01)
(52) U.S. Cl. .................. 713/165; 713/167
(58) Field of Classification Search ......... 713/164–167, 713/189–190, 500, 502, 161, 165; 463/29, 463/30, 34
See application file for complete search history.

(56) References Cited

U.S. PATENT DOCUMENTS

| | | | |
|---|---|---|---|
| 5,032,979 A * | 7/1991 | Hecht et al. ............... | 726/25 |
| 5,332,219 A | 7/1994 | Marnell, II et al. | |
| 5,342,047 A | 8/1994 | Heidel et al. | |
| 5,575,717 A | 11/1996 | Houriet, Jr. et al. | |
| 5,599,231 A | 2/1997 | Hibino et al. | |
| 5,643,086 A | 7/1997 | Alcorn et al. | |
| 5,664,999 A | 9/1997 | Kurihara | |
| 5,725,428 A | 3/1998 | Achmuller | |
| 5,769,716 A | 6/1998 | Saffari et al. | |
| 5,770,533 A | 6/1998 | Franchi | |
| 5,935,002 A | 8/1999 | Falciglia | |
| 5,946,460 A | 8/1999 | Hohensee et al. | |
| 5,951,397 A | 9/1999 | Dickinson | |

(Continued)

FOREIGN PATENT DOCUMENTS

GB 2121569 B 7/1986

(Continued)

*Primary Examiner*—Gilberto Barron, Jr.
*Assistant Examiner*—Venkat Perungavoor
(74) *Attorney, Agent, or Firm*—Steptoe & Johnson LLP

(57) ABSTRACT

There is provided a method and system for verifying a device, having components. Identification numbers of the components are read and then verified. The process of verifying comprises matching each identification number in a database to determine whether each identification number is valid. In one embodiment, the database is remote from the device, wherein verification is performed over a network connecting a database server containing the database with the device. The device transmits the identification numbers for each of the components to the database server for verification. A file allocation structure reader may be located in a basic input/output system of the device for reading and verifying data files from a persistent storage media without loading an operating system. The device may comprise a gaming machine that contains a monitor for monitoring one or more system events being processed by the gaming machine. The monitor monitors routine and non-routine events. A detector is included for detecting selected system events so that they may be recorded.

30 Claims, 6 Drawing Sheets

U.S. PATENT DOCUMENTS

| | | | |
|---|---|---|---|
| 6,015,346 A | 1/2000 | Bennet | |
| 6,039,648 A | 3/2000 | Guinn et al. | |
| 6,073,240 A * | 6/2000 | Kurtzberg et al. | 726/21 |
| 6,083,105 A | 7/2000 | Ronin et al. | |
| 6,093,100 A | 7/2000 | Singer et al. | |
| 6,102,394 A | 8/2000 | Wurz et al. | |
| 6,102,798 A | 8/2000 | Bennet | |
| 6,135,884 A | 10/2000 | Hedrick et al. | |
| 6,149,522 A | 11/2000 | Alcorn et al. | |
| 6,159,097 A | 12/2000 | Gura | |
| 6,530,837 B2 | 3/2003 | Soltys et al. | |
| 6,908,391 B2 | 6/2005 | Gatto et al. | |
| 6,916,247 B2 | 7/2005 | Gatto et al. | |
| 6,945,870 B2 | 9/2005 | Gatto et al. | |
| 2002/0015252 A1 | 2/2002 | Noble et al. | |
| 2002/0083168 A1 * | 6/2002 | Sweeney et al. | 709/224 |
| 2003/0100369 A1 | 5/2003 | Gatto et al. | |
| 2004/0054445 A1 | 3/2004 | Volmer et al. | |
| 2004/0193726 A1 | 9/2004 | Gatto et al. | |
| 2004/0198496 A1 | 10/2004 | Gatto et al. | |
| 2005/0172336 A1 | 8/2005 | Gatto et al. | |
| 2005/0209006 A1 | 9/2005 | Gatto et al. | |
| 2005/0209007 A1 | 9/2005 | Gatto et al. | |
| 2005/0221898 A1 | 10/2005 | Gatto et al. | |
| 2005/0223219 A1 | 10/2005 | Gatto et al. | |
| 2005/0233811 A1 | 10/2005 | Gatto et al. | |
| 2005/0282637 A1 | 12/2005 | Gatto et al. | |
| 2006/0100010 A1 | 5/2006 | Gatto et al. | |

FOREIGN PATENT DOCUMENTS

| | | |
|---|---|---|
| WO | 2000/007099 | 2/2000 |
| WO | WO 2004004855 A1 | 1/2004 |

* cited by examiner

DEVICE VERIFICATION SYSTEM AND METHOD

CROSS-REFERENCE TO RELATED APPLICATIONS

This application is a divisional of U.S. patent application Ser. No. 10/243,912, filed Sep. 13, 2002 now abandoned. This application is related to co-pending U.S. patent application Ser. No. 11/464,584, filed Aug. 15, 2006.

BACKGROUND OF THE INVENTION

This invention relates generally to a method and apparatus for verifying and detecting errors in a device and, more particularly, for verifying the device before starting or continuing operation, and for monitoring and logging events that may occur in the device.

In common practice in the prior art, for example in the gaming machine field, verification of a device may occur by testing the entire contents of a read only memory (ROM) containing the application software for the device to ensure that tampering has not occurred, for example, after a prize is won during game play. An abbreviated bit string is computed from the gaming application program and stored in a secure ROM that is separate from the ROM where the gaming application is stored before deployment of the gaming machine. When the gaming machine is started, or at times when verification is desired, for example, after a win occurs during game play, a verification program calculates another abbreviated bit string from the contents of the ROM wherein the gaming application program is stored, and the previously computed abbreviated bit string stored in the secure ROM is used with the newly calculated abbreviated bit string to verify the gaming application program.

Such a verification system may be adequate where the media on which the gaming application is stored is read-only, and therefore difficult to alter, and where there is little danger that the other components of the device can be compromised to breach security, such as a casino with 24 hour surveillance. However, such constant surveillance is not always available, both inside and outside the gaming industry, and as technology advances, it becomes more difficult to rely on these safeguards. The shortcomings of prior systems become more prevalent when several devices are connected over a network.

Accordingly, there has been a long existing need for enhanced verification of devices, and more enhanced self-critical analysis of their components other than just the application software.

SUMMARY OF THE INVENTION

Briefly, and in general terms, the present invention provides an improved method and system for verifying a device, having components, before or during use.

More particularly, by way of example and not necessarily by way of limitation, the present invention provides a system and method for verifying a device by verifying the components of that device. The components may comprise, for example, software components, firmware components, hardware components, or structural components of an electronic device. These components include, without limitation, processors, persistent storage media, volatile storage media, random access memories, read-only memories (ROMs), erasable programmable ROMs, data files (which are any collections of data, including executable programs in binary or script form, and the information those programs operate upon), device cabinets (housings) or cathode ray tubes (CRTs). Identification numbers or strings of the components are read and then verified. The process of verifying may comprise matching each identification number in a database to determine whether each identification number is valid. In the case where a data file comprises one of a plurality of operating system files, verification of that file, in effect, comprises verifying part of an operating system. For data files, the file names may comprise the identification numbers.

The database may comprise a relational database, object database, or may be stored in XML format, or in a number of other formats that are commonly known. However, in the case where storage space is limited for the verification system, a flat file structure for the database may be more desirable, and require less software instructions to read and retrieve information from. The database may also comprise an independent system stack of bindings, which comprise numbers, identification strings or signatures in the database for matching or authenticating the components, from manufacturers of the components, each identification number being verified using the binding from the manufacturer of the respective component to verify the component. Especially in the context of smaller devices such as personal digital assistants (PDAs), such a system stack may comprise a subset of one or more global component databases containing bindings from manufacturers of the components, each binding of the subset being associated with at least one of the identification numbers of one of the components in the device. Providing such a limited subset helps control the size of the verification system by controlling the size of the database. Another example of a verification system in which it may be desirable to limit the size of the database is one in which the database is stored in a personal computer's (PC's) complementary metal oxide semiconductor memory (CMOS), along with other configuration settings for the PC. Storing the database in the CMOS may improve security wherein the PC may be configured such that only users with administrative passwords may change the content of the portion of the CMOS containing the database.

Structural components, such as cabinets, may contain an electronic identification chip embedded within them, such as a so-called Dallas chip or an IBUTTON device manufactured by Dallas Semiconductor of Dallas, Tex. These devices allow a unique identifier, placed within a semiconductor or chip, to be placed on a component that may or may not be electronic, such as a computer or gaming machine cabinet. The IBUTTON device is a computer chip enclosed in a 16 mm stainless steel can. The steel button can be mounted, preferably permanently or semi-permanently, on or in the structural component. Two wires may be affixed to the IBUTTON device, one on the top, and one on the bottom, to exchange data between the IBUTTON device and a processor, serial port, universal serial bus (USB) port, or parallel port.

The matching process may comprise matching each identification number based on the type of component that the identification number identifies. The identification number and the type of component is matched in the database in order to verify that the identification number is valid. The reading of the identification numbers and verifying the components may be performed at the time of start-up of the device, or periodically during operation of the device. Operation of the device may be stopped if any one of the identification numbers is not matched in the database. In the case of a game or gaming machine type of device, a tilt condition message is generated if any one of the identification numbers is not matched in the database.

The database may consist of a set of signatures, also called bindings. At least with respect to the components that comprise data files or firmware, a well-known hash function, the Secure Hash Function-1, also known as SHA-1, may be used to compute a 160-bit hash value from the data file or firmware contents. This 160-bit hash value, also called an abbreviated bit string, is then processed to create a signature of the game data using an equally well-known, one-way, private signature key technique, the Digital Signature Algorithm (DSA). The DSA uses a private key of a private key/public key pair, and randomly or pseudorandomly generated integers, to produce a 320-bit signature of the 160-bit hash value of the data file or firmware contents. This signature is stored in the database in addition to the identification number.

Either contained in the device, or attachable to the device, is a processor and a memory containing executable instructions or a software program file for verification of the components (verification software), which may itself be one of the components to verify. The verification software may be stored on a persistent storage media such as a hard disk device, read only memory (ROM), electrically erasable programmable read-only memory (EEPROM), in the aforementioned CMOS memory, battery-backed random access memory, flash memory or other type of persistent memory. Preferably, the verification software is stored in a basic input/output system (BIOS) on a solid-state persistent memory device or chip. BIOS chips have been used for storing verification software, such as the BIOS+ chip used by Bally Gaming Systems, Inc. of Las Vegas, Nev. in their EVO gaming system. Placing the verification software in the BIOS is advantages because the code in the BIOS is usually the first code executed upon boot or start-up of the device, making it hard to bypass the verification process.

Alternatively, the verification software may be stored in a firmware hub, which may comprise the part of an electronic device or computer that stores BIOS information. In personal computer hub technology, such as that manufactured by the Intel Corporation of Santa Clara, Calif., a hub is used in place of a peripheral component interconnect (PCI) bus to connect elements of chipsets.

The persistent storage media may be a removable storage unit such as a CD-ROM reader, a WORM device, a CD-RW device, a floppy disk device, a removable hard disk device, a ZIP disk device, a JAZZ disk device, a DVD device, a removable flash memory device, or a hard card device. However, the database is preferably stored in a non-removable, secure device either within the device being verified, or remotely on a server, in order to enhance security.

The verification software executes a DSA verification of the data files and firmware components. Also stored in the database is the public key of the private key/public key pair. For each data file and firmware component, as part of the DSA verification, the processor and verification software first computes the hash value of the digital contents of the component using the SHA-1 algorithm. The verification software then processes or authenticates this computed hash value, using the DSA signature verification algorithm, which also takes, as input, the aforementioned public key stored in the database. The verification part of the DSA produces a boolean result (yes or no) as to whether the inputs solve the algorithm. If the algorithm is not solved by the inputs, then an unexpected result is produced, thereby failing to verify the particular component. This may cause a fault tilt to occur to prohibit the loading operation of the device. Otherwise, use of the device is permitted. A detailed description of the DSA can be found in the U.S. government's Federal Information Processing Standards Publication (FIPS) 186-2. That publication describes each step of the DSA signature generation and verification.

Alternatively, the set of executable instructions may use the Rivest-Shamir-Adleman (RSA) algorithm to verify the components. Using the RSA algorithm, a first abbreviated bit string or hash value is computed from each component's digital contents and encrypted into a digital signature. The digital signature is stored in the database along with the identification number for the component. When the device is verified, the component is verified by computing a second abbreviated bit string computed from the component's digital contents. The signature is retrieved from the database by searching the database for the identification number. The signature is decrypted to recover the first abbreviated bit string. The component is then verified by comparing the second abbreviated bit string with the first abbreviated bit string. If the first and second abbreviated bit strings do not match, then the component is not verified. As discussed below, this may cause a fault tilt to occur to prohibit the loading operation of the device. Otherwise, use of the device is permitted.

Instead of creating a digital signature for, or signing, each data file individually, collections of data files may be signed together in order speed up processing. The abbreviated bit strings, hash values, or signatures, also called digests, of the collection of data files are collected into a catalog file, and the catalog is signed as described above.

In some cases, it may be desirable to nevertheless allow operation of a device even though a data file failed verification. For example, that data file may contain an error caused by a number of events, such as a bad sector on a hard disk, which in turn caused the failed verification of that data file. The failed verification is evidently not due to tampering of the device as the system of the present invention is generally designed to prevent. Still, operation of the device is not desirable unless and until the error in the data file is corrected. When the data file is stored in alterable media, correcting such an error may be as simple as replacing the file. Along with the identification number, and encrypted signature or abbreviated bit string, a valid replacement data file may also be stored in the database. If the software program determines that the cause of the invalid file is simply due to an error in the file, and not tampering, then the replacement file is pulled from the database to replace the data file that failed the validation. A number of factors may be used by the software program to make such a determination. For example, determination may be based on the number of data files or components that fail validation. This may indicate a deceptive replacement of a hard disk in the device.

In one embodiment, the database is remote from the device, wherein verification is performed over a network connecting a database server containing the database with the device. The device transmits the identification numbers for each of the components to the database server. The database server then performs the step of matching. For example, the device may be a personal computer (PC), with verification being performed before a transaction is allowed on a network server. A prime example of such a system is one set up for performing banking transactions with a network server owned or operated by a bank. In such a system, a bank may only allow trusted transactions using an authorized PC whose bindings for all of the components and banking transaction software have been recorded in the database located on the bank's network server, or another remote network server that is accessed by the PC. Once all of the components have been verified, the bank's network server then allows transactions to take place using the PC.

In another example, the device comprises a gaming machine, wherein the verification of the gaming machine is performed before game play is allowed on the gaming machine. The database may either be located in a secure location in the gaming machine, such as a ROM device enclosed in a lock box within the gaming machine, or remotely from the gaming machine so that the gaming machine connects to a network server containing the database over a network. As with the banking personal computer described above, the components of the gaming machine are verified at the network server after the gaming machine transmits the identification numbers, hash values, etc., to the network server.

Another aspect of the present invention is a method and system for recording event messages in a gaming machine. The device may comprise a gaming machine which contains a monitor for monitoring one or more system events being processed by the gaming machine. The operating system of the gaming machine is event driven. In an event driven system or device, applications and components respond to input from the user (mouse movement, keystrokes, menu choices, etc.) and messages from other applications and components. This is in contrast to, for example, a batch operation that continuously processes the next item from a group of instructions. The monitor comprises an event management system, which comprises software or firmware that monitors components of the device. Alternatively, the monitor may be located on a remote server, workstation or other network device. The monitor, which may comprise hardware and software components such as a processor and event management software, monitors routine and non-routine events. As an example, a coin insertion into a gaming machine will trigger a corresponding routine coin-in event message that triggers components to operate and/or software instructions to execute. Similarly, an exception fault or divide by zero condition will trigger a non-routine or error event message to be generated for example. These event messages can be generally referred to as system events.

Either included within the monitor, or separately but in close coordination with the monitor, is a detector for detecting selected system events of the one or more system events so that they may be recorded. The gaming machine, or the remote server monitoring the gaming machine, stores the event message for the detected system event in a log file.

Each monitored system event has a system event type. The detector selects the selected system event based on the system event type for the selected system event. The system event type may be a code in the event message that indicates a category of events that occur in the system that the system event belongs to. For example, the previously mentioned coin-in, exception fault and divide by zero system events are each so identified with the system event type. The detector selects the selected system event by comparing the system event type for each monitored system event to a list of system event types, and selecting one of the monitored system events for the selected system event if the system event type for the selected one monitored system event matches one of the system event types in the list. Each system event is monitored and as the detector selects a plurality of system events based on their types, the system event messages for each selected system event are stored in a log file. The list may be stored in an index or lookup file on a persistent storage media of one of the alterable types described above. The lookup file may comprise a database file, which may be relational, object based or in XML format for example. The log file may also be stored on a persistent storage media.

A buffer region of a memory may be set aside for buffering a plurality of the monitored system events, wherein the step of storing comprises storing one or more of the buffered system events in the log file with the selected one of the system events each time one of the system event types is detected by the detector. Preferably, the buffer should be large enough so that at least the last 1000 system events may be stored in the buffer, and then written if a selected system event is detected and stored. The buffer is thus operated as a first-in-first-out stack of system event messages.

Other digital contents of memory or components in the device may be stored upon detection of a selected system event. For example, it may be desirable to store the entire contents of a memory component, selected contents of a memory component, or selected or entire values for registers of a processor component of the gaming machine. For example, if a selected system event is a memory protection exception error, then it may be desirable to store at least the contents of the protected memory that was violated and the memory allocation tables for the offending application(s) that caused the error. Even if the memory in which the protection exception error occurred comprises a safe or battery-backed random access memory device, it nevertheless still may be desirable to store the contents in case other applications should further modify the memory.

As another aspect of the present invention, it is desirable to perform operations on data files, such as verification operations, such data files being stored on a persistent storage media such as a hard disk, before or without the need for loading of the operating system for an electronic device. Typically, the operating system must be started or booted in order to perform file access operations on the storage media. This is because the operating system usually exclusively contains the file access system used to read the file allocation structure stored on the storage media. However, in some devices, it would be desirable to validate data files on the storage media before booting the operating system for, among other reasons, security purposes.

In this regard, the system of the present invention has a file allocation reader stored in the basic input/output system (BIOS) or firmware hub (FWH). This makes accessing files stored in the persistent storage media or device possible in the absence of a running operating system. The processor may access the file allocation reader in the BIOS to open the file allocation structure on the persistent storage media and to read it. For faster access, the processor may move the contents of the file allocation structure into a RAM. The processor may then process the file allocation structure to or provide access to files stored on the persistent storage device.

Providing this functionality in the BIOS or FWH facilitates accessing the files stored in the storage device using a computer program stored in the basic input/output system wherein the computer program comprises a set of executable instructions for processing the file allocation structure. An example of such a computer program that may benefit from this new functionality in the BIOS or FWH is the verification program described above for verifying software components on the persistent storage media. In that case, operating system files may be verified, and this providing of access to files stored on the storage media through the BIOS allows such verification to take place before the operating system is booted, or before any software program is run from the storage media. This makes the verification software completely independent of files stored on the persistent storage media that are being verified.

As described above, verifying the data files may comprise verifying each data file by retrieving a first abbreviated bit string computed from the file from the database, computing a second abbreviated bit string from the data file, and verifying the file by authenticating the second abbreviated bit string using the first abbreviated bit string. As described above, the database of signatures or abbreviated bit strings may be stored in the BIOS as well, wherein the verification software uses DSA or RSA to verify each data file against the corresponding signature or abbreviated bit string stored in the database. The file allocation reader in the BIOS or FWH may be configured to read a 32-bit based file allocation table, a 16-bit based file allocation table, a WINDOWS NT file system structure, or any other file allocation structure used by the persistent storage media.

These and other objects and advantages of the invention will become apparent from the following more detailed description, when taken in conjunction with the accompanying drawings of illustrative embodiments.

DETAILED DESCRIPTION OF THE PREFERRED EMBODIMENTS

Figure 1:
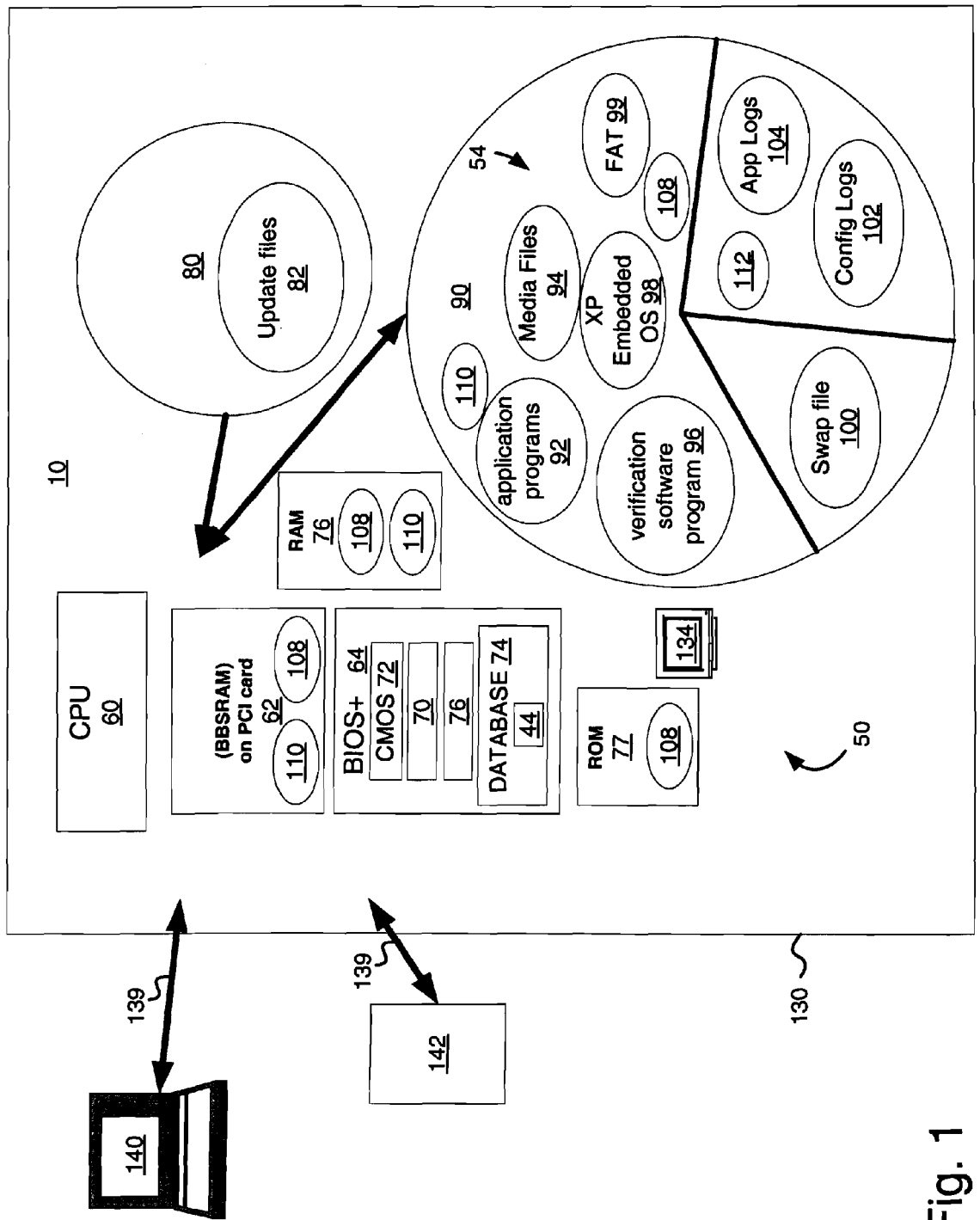
FIG. 1 is a block diagram illustrating a device and components capable of verification before and during use of the device using the system and methods of the present invention.

Referring now to the drawings, like reference numerals denote like or corresponding parts throughout the drawing figures.

With reference to FIG. 1, a block diagram illustrating a device 10 and components 50 capable of verification before and during use of the device 10 using the system and methods of the present invention is shown. The components 50 may comprise, for example, software or data file components 54, firmware components 64-74, hardware components 60, 62, 80, 90, or structural components 130 of the device 10. These components include, without limitation, one or more processors 62, persistent storage media 80 and 90, volatile storage media such as random access memories (RAMs) 76, read-only memories (ROMs) 77 or electrically erasable programmable ROMs (EEPROMS) such as basic input/output systems (BIOS) 64. Components 50 may also include data files 54 (which are any collections of data, including executable programs in binary or script form, and the information those programs operate upon), device cabinets (housings) 130, cathode ray tubes (CRTs) 134, or compact disk read only memory (CDROM) or CD read-write (CR-RW) storage 80. The data files 54 may include data files 100-104, software program files 92-96, operating system files 98, or file allocation tables or structures 99. Ports 139 may be included with the device 10 for connection to diagnostic systems 140 and other input/output devices 142. The ports 139 may each comprise a serial port, universal serial bus (USB) port, parallel port or any other type of known port, including a wireless port. Preferably, each of the components 50 have embedded or loaded in them identification numbers or strings that can be accessed by the processor 60, including the processor 60 itself, which are utilized for verification as explained below. The data files 54 may use their file name as their identification number of string.

Either within the device 10, or in the diagnostic system 140 attachable to the device 10, are executable instructions or a software program 70 for verification of the components (verification software 70), which may itself be one of the components 50 to verify if it is internal to the device 10. The verification software 70 is may be stored on a persistent storage media such as the hard disk device 90, ROM 77, EEPROM 64, in a complementary metal oxide semiconductor memory (CMOS) 72, in safe ram comprising a battery-backed static random access memory (BBRAM) 62, in a flash memory or other type of persistent memory. Preferably, the verification software 70 is stored in a basic input/output system (BIOS) 64 device or chip. BIOS chips 64 have been used for storing prior verification software, such as previous versions of the BIOS+ chip used by Bally Gaming Systems, Inc. of Las Vegas, Nev. in their EVO gaming system. Placing the verification software 70 in the BIOS 64 is advantages because the code in the BIOS 64 is usually the first code executed upon boot or start-up of the device 10, making it hard to bypass the verification process.

Alternatively, the verification software 70 may be stored in a firmware hub (FWH), which may comprise the part of an electronic device 10, which may be a computer, that stores BIOS information. Hub technology is currently being developed and used by the Intel Corporation of Santa Clara, Calif. Usually, so called north and south bridges link elements of chip sets through a peripheral component interconnect (PCI) bus. In the hub architecture, the elements are connected via an interlink dedicated bus. This is a high-speed bus, currently with twice the bandwidth of the PCI bus. Typically, the interlink bus operates at 133 MHz in 2× mode. Being 64 bits wide the interlink provides a bandwidth of 266 MB/sec (2×133.000.000×8 byte). One such hub is known as a firmware hub (FWH). Intel's 82802 FWH stores system BIOS and video BIOS in a 4 Mbit or 8 Mbit EEPROM or flash EEPROM.

As another alternative, the persistent storage media that stores the verification software 70 may be a removable storage unit such as the CD-ROM or CD-RW device 80, a WORM device, a floppy disk device, a removable type of hard disk device 90, a ZIP disk device, a JAZZ disk device, a DVD device, a removable flash memory device, or a hard card type of hard disk device 90. However, the database 74 containing verification data used by the verification software 70, described below, is preferably stored either within the device 10 being verified in a non-removable, secure device, such as the BIOS+ 64 shown in FIG. 1, or remotely on a server for networked devices.

Figure 2:
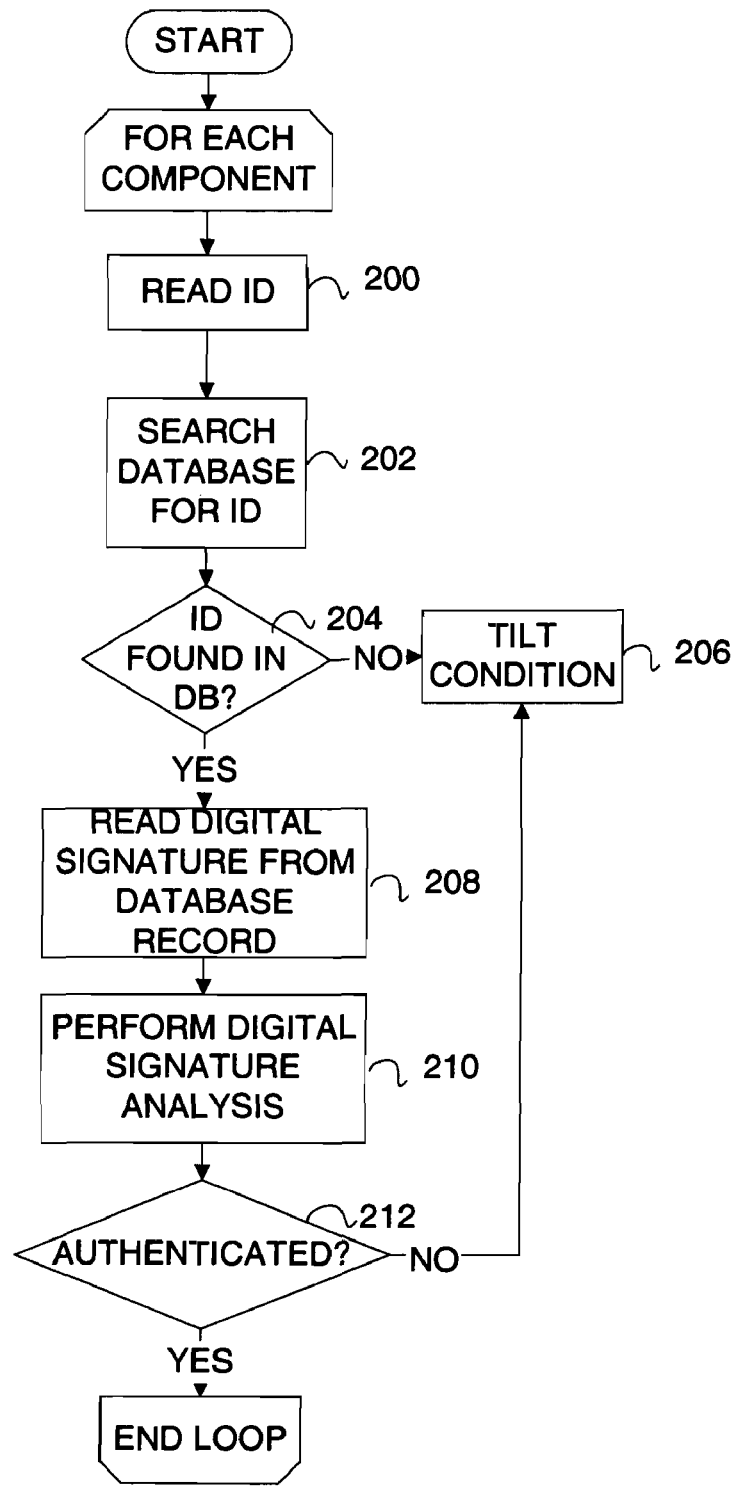
FIG. 2 is a flow diagram illustrating the steps for performing verification of the device of FIG. 1.

With reference to FIG. 2, a flow diagram illustrating the steps for performing verification of the device 10 of FIG. 1 is shown. Beginning at step 200, identification numbers of the components 50 are read and then verified. Each identification number is then searched in the database 74 to determine whether each identification number is valid, step 202. The determination may be as simple as checking for whether the identification number exists in the database. If the identification number is not found in the database 74, step 204, then a tilt condition message is generated in the device 10, step 206, which may end operation of the device 10.

Preferably, digital signatures of the digital contents of at least the data files 54 and firmware of the components 50 are also used to perform verification as explained in detail below. In the database record where the identification number was located in the database 74, 74, an abbreviated bit string, or encrypted signature, created from the data file 54 or firmware of the component 50 when the device 10 was first assembled or before the device 10 was deployed, is stored. The verification software 70 contains instructions that cause the processor 60 to read the signature from the database record, step 208. A digital signature analysis is performed, step 210. If the data file 54 or firmware of the component 50 fails an authentication, step 212, then a tilt condition message is generated in the device 10, step 206, which may end operation of the device 10.

In the case where a data file 54 comprises one of a plurality of operating system files 98, verification of that file 54, in effect, comprises verifying part of an operating system 98.

The database 70 may comprise a relational database, object database, or may be stored in XML format, or stored in a number of other formats that are commonly known. However, in the case where storage space is limited for the verification system, a flat file structure for the database 70 may be more desirable, and require less software instructions to read and retrieve information from. The database 70 may also comprise an independent system stack of bindings from manufacturers of the components 50, each identification number being verified using the binding from the manufacturer of the respective component 50 to verify the component 50. Especially in the context of smaller devices 10 such as personal digital assistants (PDAs), such a system stack may comprise a subset of one or more global component databases containing bindings from manufacturers of the components 50, each binding of the subset being associated with at least one of the identification numbers of one of the components 50 in the device 10. Providing such a limited subset helps control the size of the verification system by controlling the size of the database 70. Another example of a verification system in which it may be desirable to limit the size of the database is one in which the database is stored in a personal computer's (PC's) complementary metal oxide semiconductor memory (CMOS) 74, along with other configuration settings for the PC. Storing the database in the CMOS 74 may improve security wherein the PC may be configured such that only users with administrative passwords may change the content of the portion of the CMOS 74 containing the database 70.

Structural components 130, such as cabinets, may contain an electronic identification chip embedded within them, such as a Dallas chip or an IBUTTON device manufactured by Dallas Semiconductor of Dallas Tex. IBUTTONs devices allow a unique identifier, placed within a semiconductor or chip, to be placed on a component 50 that may or may not be electronic, such as a computer or gaming machine cabinet 130. The IBUTTON is, in effect, a computer chip enclosed in a 16 mm stainless steel can. It can be mounted, preferably permanently or semi-permanently, on or in the structural component 130.

The searching or matching of each identification number may comprise matching each identification number based on the type of component 50 that the identification number identifies. The identification number and the type of component are matched in the database in order to verify that the identification number is valid. Each database record in the database 70 contains the type of component 50 that the identification number in that record is supposed to represent. The type of component 50 may be recognized by the verification software either by the location from which the identification number was read, or by performing a test of each component 50 to determine its type. For example, in some electronic devices 10, the processor 60 may always be located at location 0 on the PCI bus or firmware hub of the device 10. Alternatively, by testing the component 50, the verification software 70 may find registers, which may indicate that the component 50 is a processor 60. Otherwise, the identification number itself may be formatted to indicate the type of component 50.

The reading of the identification numbers and verifying the components 50 may be performed at the time of start-up of the device 10, or periodically during operation of the device 10. Operation of the device may be stopped if any one of the identification numbers are not matched in the database 10 or if the digital contents of a components 50 are not authenticated with the corresponding digital signature stored in the database 74. A tilt condition message is generated by the verification software 70 if any one of the identification numbers is not matched in the database 74.

The signatures in the database 74 are also referred to as bindings. When the components 50 are installed before the device 10 is put into operation in the relevant field of use, at least with respect to the components 50 that comprise data files 54 or contain firmware, a well-known hash function, the Secure Hash Function-1 (SHA-1), may be used for authentication. The SHA-1 computes a 160-bit hash value from the contents of the data file 54 or firmware. This 160-bit hash value, also called an abbreviated bit string, is then processed to create a signature of the game data using an equally well-known, one-way, private signature key technique, the Digital Signature Algorithm (DSA). The DSA uses a private key of a private key/public key pair, and randomly or pseudorandomly generated integers, to produce a 320-bit signature of the 160-bit hash value of the data file 54 or firmware contents of the component 50. This signature is stored in the database 74 in addition to the identification number.

When the device 10 is in operation in the relevant field of use, to perform a verification of the device 10, the verification software executes a DSA verification of the data files 54 and firmware of the components 50. Also stored in the database 74 is the public key of the private key/public key pair. For each data file 54 and firmware of each component 54, as part of the DSA verification, the processor 60 and verification software 70 first computes the hash value of the digital contents of the component 50 or data file 54 using the SHA-1 algorithm. The verification software 70 contains instructions that cause the processor 60 to then processes or authenticate this computed hash value with the stored signature, using the DSA signature verification algorithm, which also takes, as input, the aforementioned public key stored in the database 74. The verification part of the DSA produces a boolean result (yes or no) as to whether the inputs solve the algorithm. If the algorithm is not solved by the inputs, then an unexpected result is produced, thereby failing to verify the particular component 50 or data file 54. A tilt message is generated which triggers a shut-down mechanism to prohibit the loading operation of the device 10 or to stop operation of the device 10 if verification is performed during operation. Otherwise, use of the device 10 is permitted. A detailed description of the DSA can be found in the U.S. government's Federal Information Processing Standards Publication (FIPS) 186-2. That publication describes each step of the DSA signature generation and verification.

Alternatively, the verification software 70 may use the Rivest-Shamir-Adleman (RSA) algorithm to verify the components 50. Using the RSA algorithm, a first abbreviated bit string or hash value is computed from each component's digital contents and encrypted into a digital signature. The digital signature is stored in the database 74 along with the identification number for the component 50. When the device is verified, the component 50 is verified by computing a second abbreviated bit string computed from the component's digital contents. The signature is retrieved from the database 74 by searching the database 74 for the identification number. The signature is decrypted to recover the first abbreviated bit string. The component 50 is then verified by comparing the second abbreviated bit string with the first abbreviated bit string. If the first and second abbreviated bit strings do not match, then the component 50 is not verified. A tilt message is generated which triggers a shut-down mechanism to prohibit the loading operation of the device 10 or to stop operation of the device 10 if verification is performed during operation. Otherwise, use of the device 10 is permitted.

Instead of creating a digital signature for, or signing, each data file 54 individually, collections of data files 54 may be signed together in order speed up processing. The abbreviated bit strings, hash values, or signatures, also called digests, of data files 54 are collected into a catalog file, and the catalog is signed as described above. The verification software 70 identifies each file as being a member of a particular catalog, which can be done by cross referencing the name of the data file or the identification number, in the database 74. For verification, abbreviated bit strings are computed from each of the digital files 54, and collected into a catalog, which is itself signed, and then verified using DSA or RSA verification techniques as described above. Thus, the catalog itself becomes a signed data file 54 that is verified, just as if it was an individual data file 54.

Figure 3:
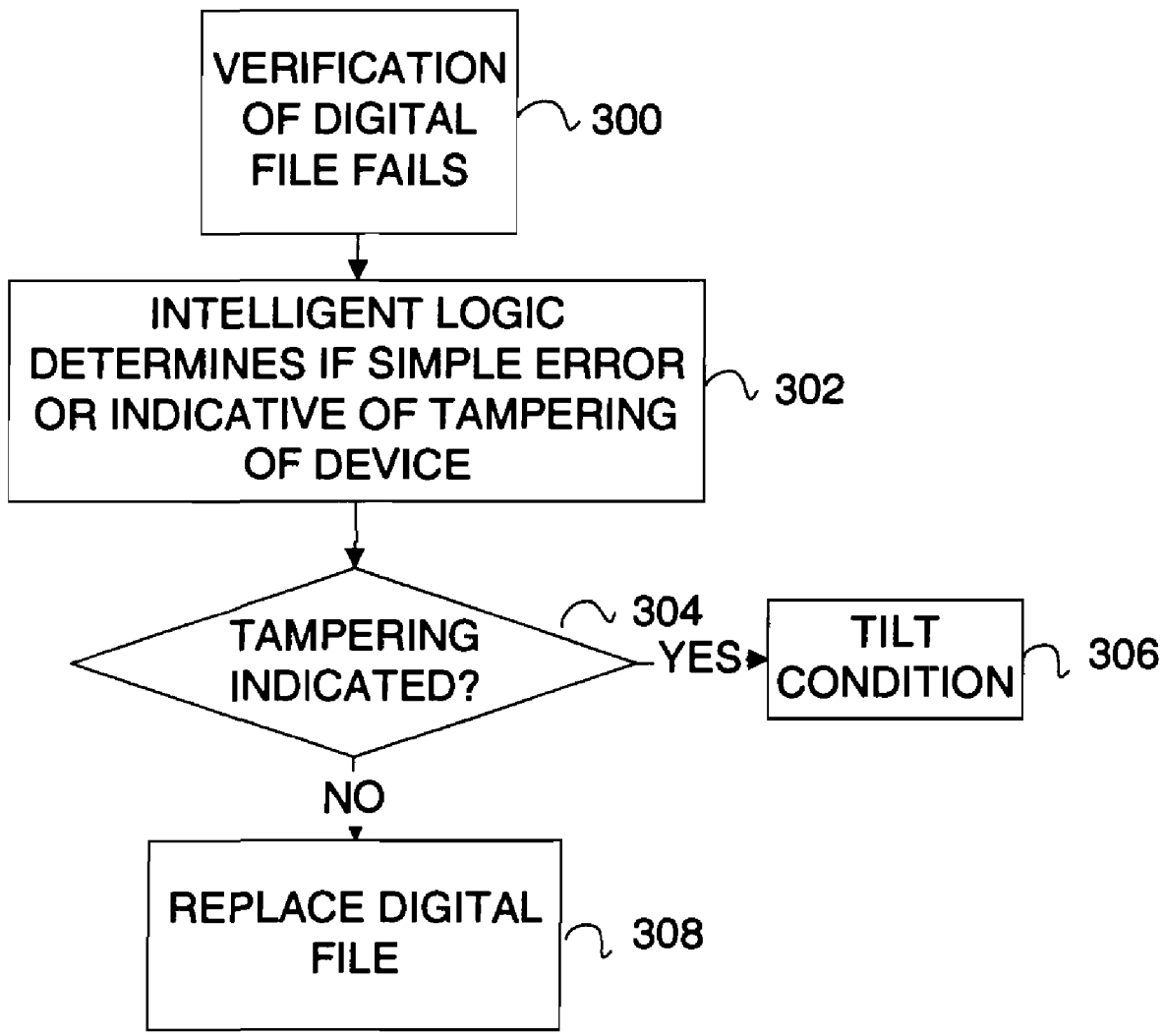
FIG. 3 is a flow diagram illustrating the steps performed by the system of FIG. 1 for replacing data files that are unverified or contain errors.

With reference to FIG. 3, a flow diagram illustrating the steps performed by the system of FIG. 1 for replacing data files 54 that are unverified or contain errors is shown. In some cases, it may be desirable to nevertheless allow operation of a device 10 even though a data file 54 failed verification. For example, that data file 54 may contain an error caused by a number of events, such as a bad sector on the hard disk 90, which in turn caused the failed verification of that data file 54. In that example, the failed verification is evidently not due to tampering of the device 10 as the system of the present invention is generally designed to prevent. Still, operation of the device 10 is not desirable unless and until the error in the data file 54 is corrected. When the data file 54 is stored in alterable media 90, correcting such an error may be as simple as replacing the file 54. Along with the identification number, and encrypted signature or abbreviated bit string, a valid replacement data file 44 may also be stored in the database 74. Starting with step 300, the verification software 70 finds an invalid data file 54 as described above with reference to FIG. 2. The verification software 70 may contain logic that examines the failed verification to determine whether the cause of the invalid data file 54 is simply an error in the data file 54, and not tampering, step 302. Such logic may comprise, for example, fuzzy logic, which uses historical data to determine if the circumstances surrounding the failed verification most likely indicate a simple error instead of tampering. A number of factors may be used by the verification software 70 to make such a determination. For example, determination may be based on the number of data files 54 or components that fail verification. Historical data in the fuzzy logic may show that having a certain percentage of failed verifications may indicate tampering of the device 10. This may indicate a deceptive replacement of the hard disk 90 in the device 10 for example. If the verification software so indicates that tampering of the device 10 was most likely to have occurred, step 304, then a tilt message is generated, step 306. Otherwise, a replacement data file 54 is pulled from the database 74 to replace the data file 54 that failed the validation, step 308.

Alternatively to storing the replacement, or update, files in the database 74, the update files may be located in the CDROM or CD-RW device 80 as indicated at 82. Storing the update files 82 on the CD device 80 is preferable if the data files 54 are large, while the database itself 74 remains stored securely in the BIOS+ 64. The update files 82 are organized in a large update file database for easy indexing by identification number.

Figure 4:
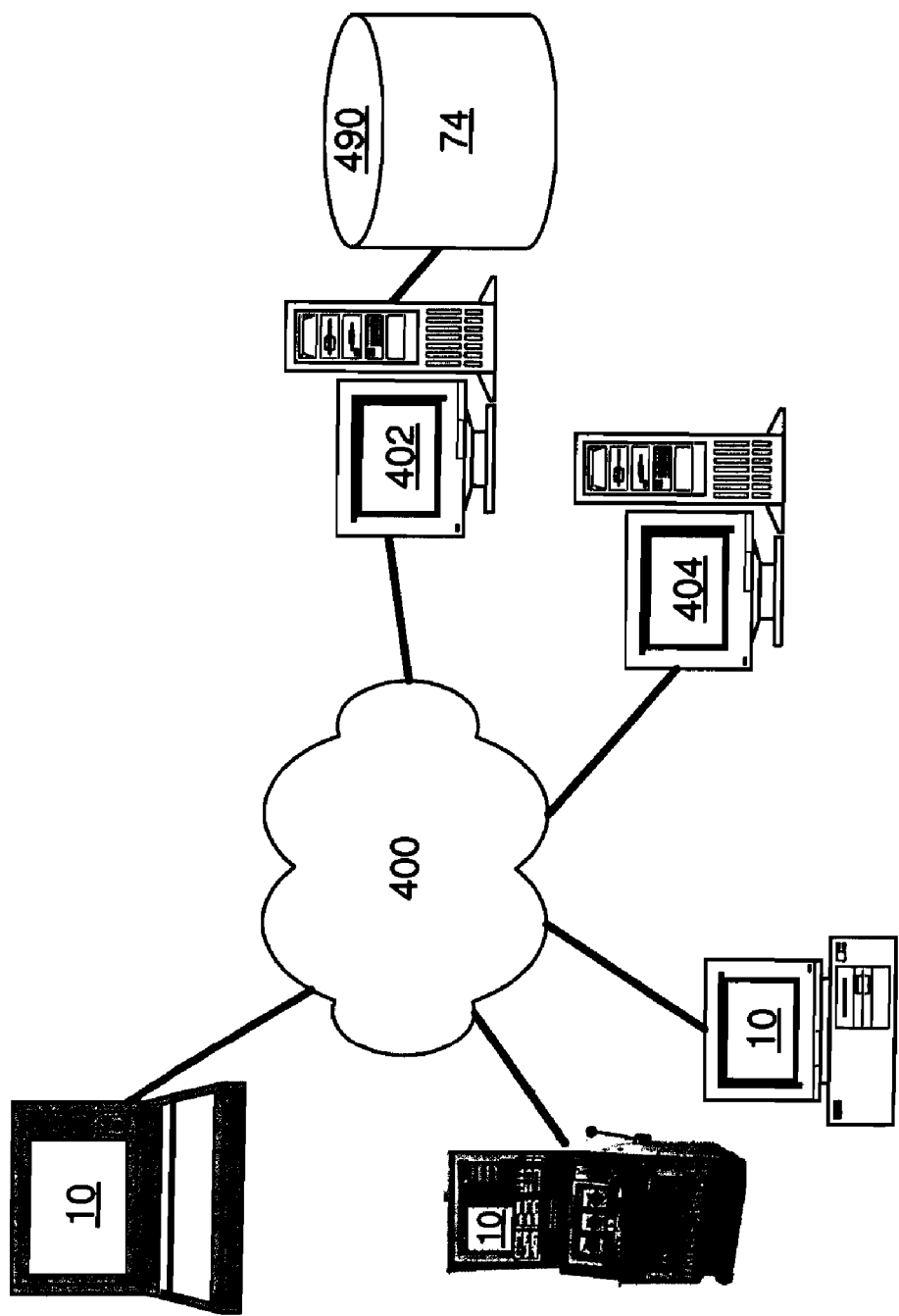
FIG. 4 is a block diagram illustrating the structure of a network that may be used with the device of FIG. 1.

With reference to FIG. 4, a block diagram illustrating the structure of a network that may be used with the device of FIG. 1 is shown. In one embodiment, the database 74 is remote from the device 10, or a plurality of devices 10, wherein verification is performed over a network 400 connecting a database server 402 containing the database 74 with the device 10. The database 74 is stored in a persistent storage media 490 inside or connected to the database server 402. The device transmits the identification numbers for each of the components 50 (FIG. 1) to the database server 402. The database server 402 then performs the step of matching using its own version of the verification software 70 described herein. For example, the device 10 may be a personal computer (PC), with verification being performed before a transaction is allowed on a network server 404. A prime example of such a system is one set up for performing banking transactions with the network server 404 owned or operated by a bank. In such a system, a bank may only allow trusted transactions using an authorized PC 10 whose bindings for all of the components 50 and banking transaction software (92 in FIG. 1) have been recorded in the database 74. The database may be either located on the bank's network server 404, or the remote network server 402. Once all of the components have been verified, the bank's network server 402 then allows transactions to take place using the PC 10.

In another example, the device 10 comprises a gaming machine 10, wherein the verification of the gaming machine 10 is performed before game play is allowed on the gaming machine. The database 74 may either be located in a secure location in the gaming machine 10, such as a ROM device 77 enclosed in a lock box within the gaming machine 10, or remotely from the gaming machine 10 so that the gaming machine 10 connects to the network server 402 containing the database 74 over the network 400. As with the banking personal computer 10 described above, the components 50 of the gaming machine 10 are verified at the network server 402 after the gaming machine 10 transmits the identification numbers, hash values, etc., to the network server 402.

Another aspect of the present invention is a method and system for recording event messages in a gaming machine 10. The device 10 may comprise a gaming machine 10, which contains a monitor 108 for monitoring one or more system events being processed by the gaming machine 10. The monitor 108 may comprise a set of executable instructions, or a software program, which may be located in a variety of places within the gaming machine 10 ready for loading into RAM 76 for execution by the processor during operation of the gaming machine 10. For example, the monitor 108 may be stored on the hard disk 90, ROM 77 or BBRAM 62. Preferably, the operating system 98 of the gaming machine 10 is event driven. In an event driven system or device 10, applications 92 and components 50 respond to input from the user (mouse movement, keystrokes, menu choices, etc.) and messages from other applications 92 and components 50. This is in contrast to, for example, a batch operation that continuously processes the next item from a group of instructions. The monitor 108 comprises an event management system, which comprises software or firmware that monitors the applications 92, operating system 98 processes and other components 50 of the device. Alternatively, at least parts of the monitor 108 may be located on a remote server 402, workstation or other network devices.

Figure 5:
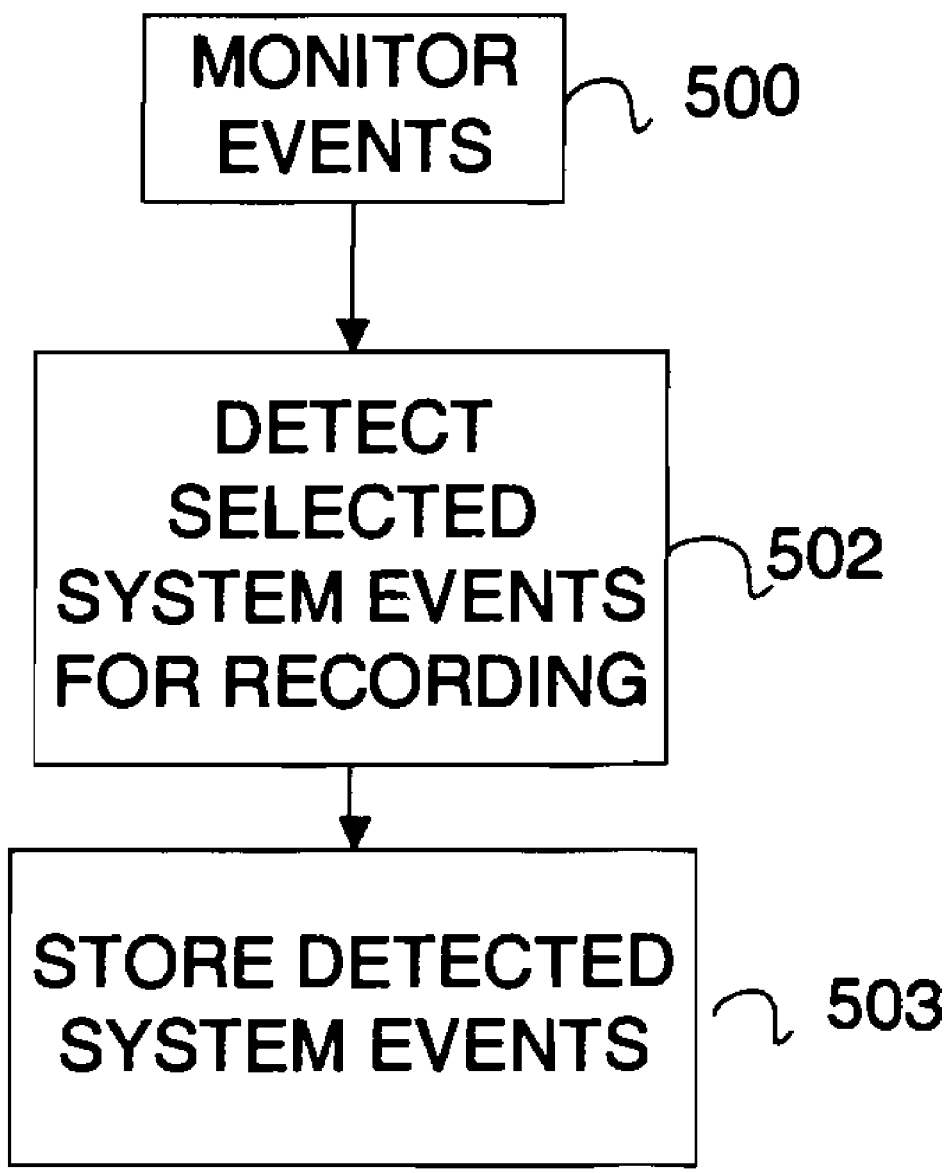
FIG. 5 is a flow diagram illustrating the steps preformed by a monitor in a gaming machine embodiment of FIG. 1.

With reference to FIG. 5, a flow diagram illustrating the steps preformed by the monitor 108 and gaming machine 10 is shown. The monitor 108, which may alternatively comprise both hardware and software components 50 in the device 10. such as its own processor 60 and event management software 92, monitors routine and non-routine events or event messages generated in the gaming device, step 500. As an example, a coin insertion into the gaming machine 10 will trigger a corresponding routine coin-in event message that triggers components 50 to operate and/or software instructions to execute. Similarly, an exception fault or divide by zero condition will trigger a non-routine or error event message to be generated. These event messages can be generally referred to as system events or event messages.

Either included within the monitor 108, or separately but in close coordination with the monitor 108, is a detector 110 for detecting selected system events of the one or more system events so that they may be recorded, step 502. The gaming machine 10, or the remote server 402 monitoring the gaming machine 10, stores the event message for the detected system event in a log file 104 on a persistent storage device such as the hard disk 90 or a persistent storage media 490 on the remote server 402.

In the step of detecting, step 502, each monitored system event is of a certain type, which, for reference purposes, can be referred to as a system event type. The detector 110 selects the selected system event based on the system event type for the selected system event. The system event type may, for example, comprise a code in the event message that indicates a category of events that occur in the gaming machine 10 that the system event belongs to or from which the event message was generated. For example, the previously mentioned coin-in, exception fault and divide by zero system events are each so identified with the system event type. In step 502, the detector 110 selects the selected system event by comparing the system event type for each monitored system event to a list of system event types, and selecting one of the monitored system events for the selected system event if the system event type for the selected one monitored system event matches one of the system event types in the list. Each system event is monitored and as the detector selects a plurality of system events based on their types, the system event messages for each selected system event is stored in the log file 104 on the hard disk 90. The list may be stored in an index or lookup file 112 on the hard disk 90. The lookup file may comprise a database file 112 which may be relational, object based or in XML format for example.

A buffer region of the RAM 76 may be set aside for buffering a plurality of the monitored system events, wherein the step of storing, step 503, comprises storing one or more of the buffered system events in the log file 104 each time one of the system event types for storing is detected in step 502 by the detector 110. Preferably, the buffer in RAM 76 should be large enough so that at least the last 1000 system events may be stored in the buffer, and then written to the log file 104 if a selected system event is detected and stored. The buffer in RAM 76 is thus operated as a first-in-first-out stack of system event messages.

Other digital contents of memories 62 and 76, or components 50 in the gaming machine 10 may be stored upon detection of a selected system event. For example, it may be desirable to store the entire contents of a memory of a component 50, selected contents of a memory of a component 50, or selected or entire values for registers of a processor component 60 of the gaming machine 10. For example, if a selected system event is a memory protection exception error, then it may be desirable to store at least the contents of the protected memory in RAM 76 that was violated and memory allocation tables for the offending application(s) that caused the error. Even if the memory portion in which the protection exception error occurred comprises a safe RAM or battery-backed memory device 62, it nevertheless still may be desirable to store the contents of that memory 62 in case other applications should further modify the memory 62.

Figure 6:
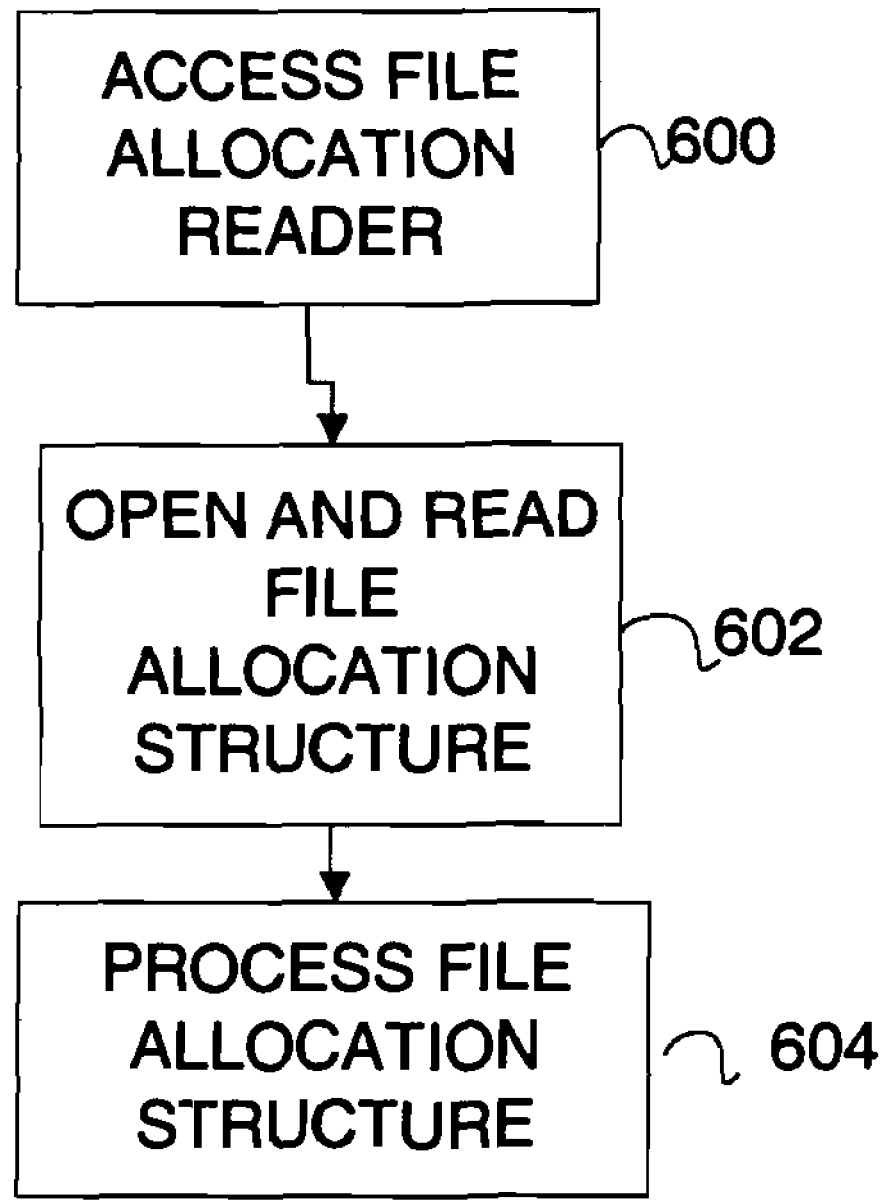
FIG. 6 is a flow diagram illustrating the steps for reading a file allocation structure or file allocation table of a persistent storage media in the device of FIG. 1.

With reference to FIG. 6, a flow diagram illustrating the steps for reading a file allocation structure or file allocation table 99 of a persistent storage media is shown. As another aspect of the present invention, it is desirable to perform operations on data files 54 stored on the persistent storage media, such as verification operations, before or without the need for the operating system 98 for an electronic device 10 is loaded. Typically, the operating system 98 must be loaded, and started or booted, in order to perform file access operations on persistent the storage media 90. This is because the operating system usually exclusively contains the file access system used to read the file allocation structure 99 stored on the storage media 90. However, in some devices 10, it would be desirable to validate data files 54 on the persistent storage media 90 before booting the operating system 99 for, among other reasons, security purposes.

In that regard, the system of the present invention has a file allocation reader 76 stored in the BIOS or FWH 64. This makes accessing files stored in the persistent storage media 90 possible in the absence of a running operating system 98. The processor 60 may access the file allocation reader 76 stored in the BIOS, step 600, to open the file allocation structure 99 on the persistent storage media 90 and to read it, step 602. The file allocation reader 76 is a computer program which comprises a set of executable instructions for processing the file allocation structure such as that used by the operating system 98. For faster access, the processor 60 may move the contents of the file allocation structure 99 into a RAM 76. The processor 60 may then process the file allocation structure 604 to provide access to files stored in the storage device.

An example of such an application that may benefit from this new functionality in the BIOS is the verification software 70 described above for verifying software components or data files 54 on the persistent storage media 90. In that case, operating system files 98 may be verified before loading or booting, or before any software program 92 is run from the persistent storage media 90. This makes the verification software 70 completely independent of data files 54 stored on the persistent storage media 90 which are being verified.

As described above, verifying the data files 54 may comprise verifying each data 54 file by retrieving a first abbreviated bit string computed from the file from the database 74, computing a second abbreviated bit string from the data file 54, and verifying the file by authenticating the second abbreviated bit string using the first abbreviated bit string. As described above, the database of signatures or abbreviated bit strings 74 may be stored in the BIOS 64 as well, wherein the verification software uses DSA or RSA to verify each data file 54 against the corresponding signature or abbreviated bit string stored in the database 74. The file allocation reader 76 in the BIOS or FWH 64 may be configured to read a 32-bit based file allocation table 99, a 16-bit based file allocation table 99, a WINDOWS NT file system structure 99, or any other file allocation structures 99 used by the persistent storage media 90.

It will be apparent from the foregoing that, while particular forms of the invention have been illustrated and described, various modifications can be made without departing from the spirit and scope of the invention. Accordingly, it is not intended that the invention be limited, except as by the appended claims.

What is claimed is:

1. A method for authenticating game data, booting an operating system, and recording event messages in the operating system of a gaming machine; comprising:

authenticating game data files on a storage media before booting the operating system or running any software programs from the storage media using a file allocation reader stored in a basic input/output system (BIOS) of the gaming machine to access game data files stored in the storage media without running the operating system, wherein the authenticating comprises:

opening a file allocation structure using the file allocation reader;

reading the file allocation structure using the file allocation reader;

processing the file allocation structure using a processor to provide access to files stored in the storage media; wherein the files in the storage media include installed identification data from one or more selected gaming units as to components actually installed on the selected gaming units, and wherein the files also include registered identification data for components supposed to be installed on the selected gaming units, each component including hardware components and software components, and each gaming unit including multiple components with identification data; and examining the installed identification data and registered identification data to determine enablement of the gaming units;

booting the operating system;

monitoring one or more system events being processed by the gaming machine;

detecting a selected one of the one or more system events for recording; and storing an event message for the detected system event in a log file.

2. The method of claim 1, wherein each monitored system event has a system event type.

3. The method of claim 1, wherein the step of detecting comprises selecting the selected system event based on the system event type for the selected system event.

4. The method of claim 1, wherein the step of selecting comprises comparing the system event type for each monitored system event to a list of system event types, and selecting one of the monitored system events for the selected system event if the system event type for the selected one monitored system event matches one of the system event types in the list.

5. The method of claim 4, wherein the list is stored in a lookup file on a persistent media in the gaming machine.

6. The method of claim 5, wherein the lookup file comprises a database file.

7. The method of claim 1, wherein the log file is stored on a persistent storage media in the gaming machine.

8. The method of claim 1, wherein the log file is in XML format.

9. The method of claim 5, wherein the lookup file is in XML format.

10. The method of claim 1, wherein the step of detecting comprises detecting a plurality of selected system events.

11. The method of claim 10, comprising buffering a plurality of the monitored system events, wherein the step of storing comprises storing one or more of the buffered system events in the log file with the selected one of the system events.

12. The method of claim 1, the step of storing further comprising storing the contents of a memory after the selected one of the one or more system events is detected.

13. The method of claim 12, wherein the memory comprises a safe ram device.

14. The method of claim 1, the step of storing further comprising storing the contents of a register of a processor after the selected one of the one or more system events is detected.

15. A system for authenticating game data, booting an operating system, and recording event messages in the operating system of a gaming machine; comprising:

a basic input/output system (BIOS) located in the gaming machine, wherein the BIOS contains a file allocation reader for authenticating game data files on a storage media before booting the operating system or running any software programs from the storage media by accessing game data files stored in the storage media without running the operating system, wherein the authenticating comprises opening a file allocation structure using the file allocation reader, reading the file allocation structure using the file allocation reader, processing the file allocation structure using a processor to provide access to files stored in the storage media; wherein the files in the storage media include installed identification data from one or more selected gaming units as to components actually installed on the selected gaming units, and wherein the files also include registered identification data for components supposed to be installed on the selected gaming units, each component including hardware components and software components, and each gaming unit including multiple components with identification data, and examining the installed identification data and registered identification data to determine enablement of the gaming units;

a system monitor for monitoring one or more system events being processed by the gaming machine;

a detector for selecting one of the one or more system events for recording; and a storage device for storing an event message for the detected system event in a log file.

16. The system of claim 15, wherein each monitored system event has a system event type.

17. The system of claim 16, wherein the detector is for selecting the selected system event based on the system event type.

18. The system of claim 16, wherein detector is for selecting the selected system event by comparing the system event type for each monitored system event to a list of system event types, and for selecting one of the monitored system events as the selected system event if the system event type for the selected one monitored system event matches one of the system event types in the list.

19. The system of claim 18, wherein the list is stored in a lookup file on a persistent storage media in the gaming machine.

20. The system of claim 19, wherein the lookup file comprises a database file.

21. The system of claim 15, wherein the storage device comprises a persistent storage media.

22. The system of claim 15, wherein the log file is in XML format.

23. The system of claim 19, wherein the lookup file is in XML format.

24. The system of claim 15, wherein the detector is for detecting a plurality of selected system events.

25. The system of claim 21, comprising a buffer for buffering a plurality of the monitored system events, wherein the persistent storage media is for storing one or more of the buffered system events in the log file with the selected one of the system events.

26. The system of claim 15, wherein the detector comprises a portion of the monitor.

27. The system of claim 15, wherein the monitor is a software program comprising a set of executable instructions.

28. The system of claim 15, the storage device further for storing the contents of a memory after the selected one of the one or more system events is detected.

29. The system of claim 28, wherein the memory comprises a safe ram device.

30. The system of claim 15, the storage device further for storing the contents of a register of a processor after the selected one of the one or more system events is detected.

* * * * *

UNITED STATES PATENT AND TRADEMARK OFFICE
CERTIFICATE OF CORRECTION

PATENT NO. : 7,836,302 B2
APPLICATION NO. : 11/464594
DATED : November 16, 2010
INVENTOR(S) : James W. Morrow et al.

It is certified that error appears in the above-identified patent and that said Letters Patent is hereby corrected as shown below:

Column 3
In line 28, replace "advantages" with --advantageous--

Column 4
In line 22, insert --to-- after "order" and before "speed"

Column 8
In line 3, delete "of" after --number--
In line 9, delete "is" before --may--
In line 12, replace "ram" with --RAM--
In line 20, replace "advantages" with --advantageous--
In line 67, delete "74" after --74--

Column 9
In line 45, insert --,-- after "Dallas" and replace "IBUTTONs" with --IBUTTON--

Column 10
In line 9, replace "components" with --component--
In line 36, replace "54" after "component" with --50--
In line 41, replace "processes" with --process--

Column 11
In line 13, insert --to-- after "order" and before "speed"

Column 12
In line 34, insert --10-- after "machine"

Signed and Sealed this
Fifth Day of April, 2011

David J. Kappos
*Director of the United States Patent and Trademark Office*

CERTIFICATE OF CORRECTION (continued)
U.S. Pat. No. 7,836,302 B2

Column 13
In line 2, replace "preformed" with --performed--
In line 4, delete "." after "10"
In lines 42 and 43, replace "messages" with --message--

Column 14
In line 18, insert --the-- before "persistant" and remove "the" after "persistant"

Column 16
In line 8, replace "ram" with --RAM--

Column 18
In line 1, insert --for-- after "device" and remove "for" after "further"
In line 5, replace "ram" with --RAM--
In line 6, insert --for-- after "device" and remove "for" after "further"